(12) United States Patent
Stanley

(10) Patent No.: US 8,200,470 B2
(45) Date of Patent: Jun. 12, 2012

(54) SYSTEMS AND METHODS FOR CURRENT ANALYSIS OF CIRCUITS INCLUDING RELATIVELY LARGE RC NETWORKS

(75) Inventor: Douglas R. Stanley, Placerville, CA (US)

(73) Assignee: Oracle America, Inc., Redwood City, CA (US)

( * ) Notice: Subject to any disclaimer, the term of this patent is extended or adjusted under 35 U.S.C. 154(b) by 1080 days.

(21) Appl. No.: 12/110,402

(22) Filed: Apr. 28, 2008

(65) Prior Publication Data

US 2009/0271166 A1 Oct. 29, 2009

(51) Int. Cl.
*G06F 17/50* (2006.01)

(52) U.S. Cl. .......................... 703/14; 716/110

(58) Field of Classification Search .............. 703/13, 703/14, 15

See application file for complete search history.

(56) References Cited

U.S. PATENT DOCUMENTS

| | | | |
|---|---|---|---|
| 5,313,398 A * | 5/1994 | Rohrer et al. .................. 703/14 |
| 5,598,348 A | 1/1997 | Rusu et al. |
| 5,881,267 A | 3/1999 | Dearth et al. |
| 6,308,304 B1 * | 10/2001 | Devgan et al. ................ 716/111 |
| 6,662,149 B1 * | 12/2003 | Devgan et al. ................ 703/14 |
| 6,763,504 B2 * | 7/2004 | Rao et al. ...................... 716/113 |
| 6,854,101 B2 * | 2/2005 | Teig et al. ..................... 716/115 |
| 7,020,722 B2 | 3/2006 | Sivier et al. |
| 7,024,652 B1 * | 4/2006 | McGaughy et al. .......... 716/115 |
| 7,134,105 B2 | 11/2006 | Singh et al. |
| 7,231,338 B2 | 6/2007 | Cavanagh et al. |
| 7,555,416 B2 * | 6/2009 | Cheng et al. .................. 703/14 |

OTHER PUBLICATIONS

Miettinen, Pekka, "Hierarchical Model-Order Reduction Tool for RLC Circuits", Thesis, Helsinki University of Technology, Department of Electrical and Communications Engineering, Oct. 11, 2007.*
Dartu et al, "RC-Interconnect Macromodels for Timing Simulation", 33rd Design Automation Conference, Las Vegas, NV, 1996.*
Qian et al, "Modeling the "Effective Capacitance" for the RC Interconnect of CMOS Gates", IEEE Transactions on Computer-Aided Design of Integrated Circuits and Systems, vol. 13, No. 12, Dec. 1994.*
Lin et al, "Signal Delay in General RC Networks", IEEE Transactions on Computer-Aided Design, vol. CAD-3, No. 4, Oct. 1984.*

* cited by examiner

*Primary Examiner* — Mary C Jacob
(74) *Attorney, Agent, or Firm* — Polsinelli Shughart PC

(57) ABSTRACT

Improved performance of simulation analysis of a circuit with some non-linear elements and a relatively large network of linear elements may be achieved by systems and methods that partition the circuit so that simulation may be performed on a non-linear part of the circuit in pseudo-isolation of a linear part of the circuit. The non-linear part may include one or more transistors of the circuit and the linear part may comprise an RC network of the circuit. By separating the linear part from the simulation on the non-linear part, the size of a matrix for simulation on the non-linear part may be reduced. Also, a number of factorizations of a matrix for simulation on the linear part may be reduced. Thus, such systems and methods may be used, for example, to determine current in circuits including relatively large RC networks, which may otherwise be computationally prohibitive using standard simulation techniques.

15 Claims, 2 Drawing Sheets

SYSTEMS AND METHODS FOR CURRENT ANALYSIS OF CIRCUITS INCLUDING RELATIVELY LARGE RC NETWORKS

FIELD OF THE INVENTION

Aspects of the present invention relate to circuit analysis. More particularly, aspects of the present invention relate to analysis of circuits with relatively large resistive-capacitive (RC) networks.

BACKGROUND

Very Large Scale Integration (VLSI) circuits may be designed using electronic design automation tools, such as Computer Aided Design (CAD) tools. Analysis and/or testing of such circuits may involve various well-known simulation techniques similar to the simulation techniques used in such design tools.

The analysis of VLSI circuits may include, for example, electromigration verification. If the current driven through a metal conductor in the circuit is too great, then the atoms in the metal of the conductor may migrate along the conductive metal. Such electromigration may result in deterioration of the conductive metal and possibly failure of the circuit. Thus, accurate analysis of a circuit for electromigration or susceptibility to electromigration is important.

SUMMARY

For electromigration verification of VLSI circuits, it has been found that standard simulation techniques may be too computationally intensive/expensive to be employed when the RC network of the VLSI circuit is relatively large. A primary reason for the computational requirements is due to the run time cost of numerical methods that are used.

For example, the numerical methods may typically involve solving the matrix equation Gv=i. This is typically accomplished by factorization and back solving, as is well known in the art (e.g., Gaussian elimination, Cholesky factorization, etc.). Factorization is roughly cubic in order, while back solving is roughly quadratic in order.

For dynamic time events, i.e., any event that significantly alters the current flowing into/out of any node of the circuit, such as when power or signals driving the circuit undergo changes or dynamic elements of the circuit such as capacitors or inductors have influenced the current of any node by changes in their electric or magnetic field over time, back solving must be employed. However, factorization is only needed when the matrix changes. In circuit simulation, matrix changes are due to non-linear elements and time step changes in field effect devices, such as capacitors and inductors. Particularly for larger circuits, e.g., circuits including a relatively large RC network, it may be desirable to avoid the more computationally intensive/expensive factorizations of the matrix.

Various embodiments disclosed herein may provide improved performance of simulation analysis a circuit with some non-linear elements and a relatively large network of linear elements. Thus, various embodiments may be used, for example, to determine current in circuits including relatively large RC networks, which may otherwise be computationally prohibitive using standard simulation techniques.

Various embodiments disclosed herein involve partitioning a circuit for analysis by simulation. In general, the circuit may be partitioned so that simulation may be performed on a non-linear part of the circuit in pseudo-isolation of a linear part of the circuit. The non-linear part may comprise one or more transistors of the circuit and the linear part may comprise an RC network of the circuit. By separating the linear part from the simulation on the non-linear part, the size of the circuit, i.e., the size of the matrix, for simulation on the non-linear part may be reduced. Also, a number of factorizations of a matrix for simulation on the linear part may be reduced.

One embodiment may provide a method of analyzing a circuit including a plurality of non-linear elements and a plurality of linear elements. The method may include: partitioning the circuit into a non-linear part and a linear part; and performing simulation on the non-linear part in pseudo-isolation of the linear part. In some embodiments, partitioning the circuit into a non-linear part and a linear part may reduce a size of a matrix representation of the circuit that requires multiple factorizations for simulation.

In some embodiments, the method may include performing simulation on the linear part with the non-linear part removed. In such embodiments, partitioning the circuit into a non-linear part and a linear part may reduce a number of factorizations required for performing simulation on the linear part as compared to a number of factorizations required for performing simulation on the linear part without partitioning.

Another embodiment may provide a method of analyzing a circuit including a plurality of non-linear elements and a plurality of linear elements. The method may include: performing simulation on the linear elements with the non-linear elements removed; and performing simulation on the non-linear elements with the linear elements removed. In some embodiments, performing simulation on the linear elements may involve only a single factorization of a matrix representation of the linear elements.

In some embodiments, the method may include: determining a total capacitance of the linear elements; and modeling the linear elements as a single capacitor with a value equal to the total capacitance. In such embodiments, wherein the linear elements define an RC network, the method may include: determining current into and out of all ports of the RC network during simulation on the non-linear elements; and inputting the determined current into the simulation on the linear elements. The inputting of the determined current may be performed when simulation time reaches an even multiple of a time step of the RC network, for example. In such embodiments, a corresponding time step may be solved in the simulation on the linear elements. Further, the determining, inputting and solving may be repeated until a simulation stop time is reached in both the simulation on the linear elements and the simulation on the non-linear elements.

Another embodiment may provide a system for analyzing a circuit including a plurality of non-linear elements and a plurality of linear elements. The system may include: an input configured to receive data defining the circuit; and a processor coupled to the input and configured to partition the data defining the circuit into data defining a non-linear part and data defining a linear part and to perform simulation on the data defining the non-linear part in pseudo-isolation of the data defining the linear part. In some embodiments, the processor may be configured to partition the data defining the circuit to reduce a size of a matrix representation of the circuit that requires multiple factorizations for simulation.

In some embodiments, the processor may be configured to perform simulation on the data defining the linear part separate from the data defining the non-linear part. In such embodiments, the processor may be configured to partition the data defining the circuit to reduce a number of factorizations required for performing simulation on the data defining the linear part as compared to a number of factorizations required for performing simulation on the data defining the linear part without partitioning.

Another embodiment may provide a system for analyzing a circuit including a plurality of non-linear elements and a plurality of linear elements. The system may include: an input configured to receive data defining the circuit, including data defining the linear elements and data defining the nonlinear elements; and a processor coupled to the input and configured to perform simulation on the data defining the linear elements separate from the data defining the non-linear elements and to perform simulation on the data defining the non-linear elements separate from the data defining the linear elements.

In some embodiments, the processor may be configured to determine a total capacitance of the linear elements and to model the linear elements as a single capacitor with a value equal to the total capacitance. In such embodiments, wherein the linear elements define an RC network, the processor may be configured to determine current into and out of all ports of the RC network during simulation on the non-linear elements and to input the determined current into the simulation on the linear elements. The processor may be configured to input the determined current when simulation time reaches an even multiple of a time step of the RC network, and may be configured to solve a corresponding time step in the simulation on the linear elements. Further, the processor may be configured to continue to determine current, input the determined current and solve corresponding time steps until a simulation stop time is reached in both the simulation on the data defining the linear elements and the simulation on the data defining the non-linear elements.

Yet other embodiments may provide a computer-readable storage medium including stored instructions that, when executed by a computer, cause the computer to perform any of the methods contemplated by this disclosure. Also, other embodiments may provide a computer-readable storage medium including stored instructions as part of any of the systems contemplated by this disclosure.

DETAILED DESCRIPTION OF EMBODIMENTS

Figure 1:
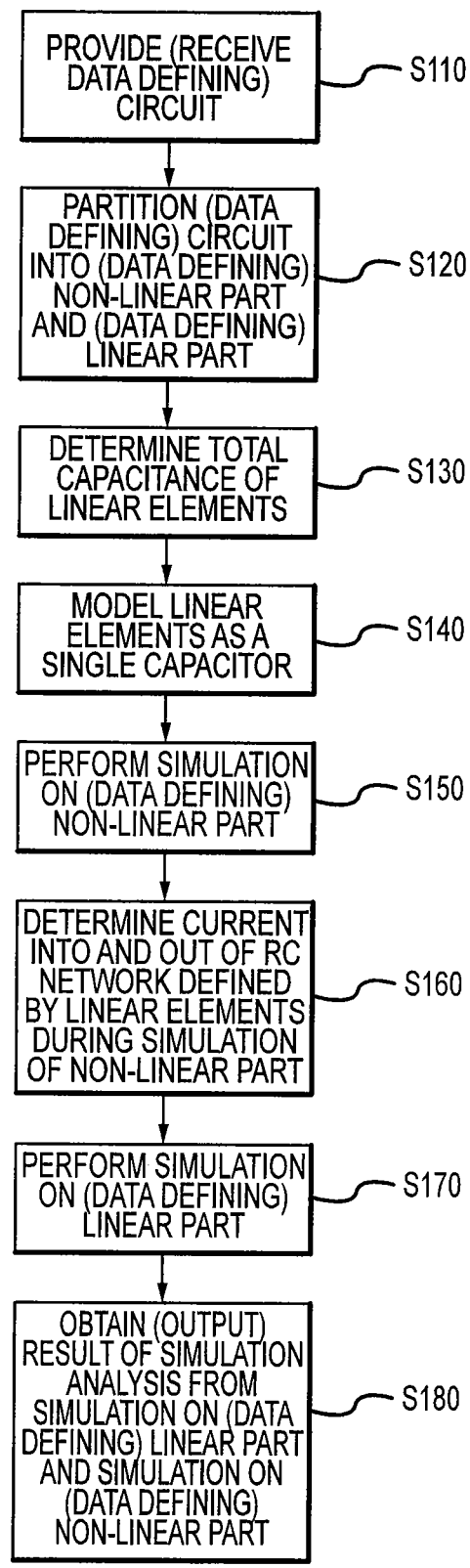
FIG. 1 illustrates a flowchart of an example of a method of analyzing a circuit using simulation.

Because the analysis of circuits including relatively large RC networks may be computationally prohibitive using standard simulation techniques, various embodiments disclosed herein contemplate a way to improve performance of simulation analysis of such circuits. Circuits including both linear and non-linear elements may be analyzed by standard simulation techniques; however, as the size of the RC network (linear elements) increases, the computational intensiveness/expensiveness of standard simulation techniques increases. Thus, at some point, the cost/benefit of designing and manufacturing circuits including larger RC networks will not justify such circuits.

For example, assume that the number of nodes in the RC network is m and the total number of nodes in the circuit, including linear and non-linear, is n. The techniques described herein are not applicable, of course, when m equals zero. When m/n is near zero, there is likely no performance gain, and possibly performance loss for lower values of n, from the techniques described herein due to performing two simulations instead of one. As m/n approaches one, the performance gain provided by the techniques described herein approaches an order of magnitude improvement, as the computation cost moves from $n^3$ dominated to $n^2$ dominated.

Theoretically speaking, so long as m/n is greater than 0, then performance gain ought to be realized. In practice, there exists a region of (m, n) space in the techniques described herein outperform standard simulation. The boundaries of this space are sensitive to the efficiency of the implementation and the performance of the computers that run the simulation. An exact determination of the boundaries is not possible from theory; instead, it may be more practical to measure the boundaries in the field given an implementation and a set of computer hardware at the time. At runtime, some trigger threshold may be configured to determine when the techniques described herein may be implemented as preferred over a standard simulation.

Various embodiments disclosed herein involve partitioning a circuit for analysis by simulation. By separating the linear part from the simulation on the non-linear part, the size of the circuit, i.e., the size of the matrix, for simulation on the non-linear part may be reduced. The reduction in the size of the matrix reduces the computational expense required to perform the numerical methods for simulation on the non-linear part. Also, a number of factorizations of a matrix for simulation on the linear part may be reduced, which also reduces the computational expense required for simulation on the linear part. Thus, the approach disclosed herein may lower the costs of simulation analysis for circuits including linear and non-linear elements, and may make it economically feasible to design and manufacture circuits with larger and larger RC networks.

In the context of analyzing a circuit including a plurality of non-linear elements and a plurality of linear elements, partitioning the circuit into a non-linear part and a linear part may be considered to involve separating non-linear elements from linear elements, identifying the elements of the circuit as belonging to the non-linear part or the linear part, or otherwise enabling simulation on the non-linear elements to be substantially separate from simulation on the linear elements. By substantially separate, it is intended to mean that at least some communication between the two simulations may be needed so that the circuit response of the non-linear elements and the linear elements in the respective simulations is sufficiently similar to the unpartitioned circuit response, i.e., the circuit response of the elements in a single simulation of the entire circuit.

Once the circuit is partitioned, the simulation on the non-linear part may be performed in pseudo-isolation of the linear part. In other words, a simulation on the non-linear part may be performed substantially separately from any simulation on the linear part, as discussed above. The effects that the non-linear part and the linear part have on each other are measured and modeled electrically as inputs to the simulation on the other part. As also discussed above, the matrix of the non-linear part is reduced relative to the matrix of the overall circuit by removing the linear part (e.g., RC network). This reduces the computational costs of factorization of the matrix as required for the non-linear part. Thus, it may still be relatively computationally inexpensive to perform multiple factorizations of the matrix per time step as may be needed by simulation on non-linear elements.

Similarly, the simulation on the linear part may be performed with the non-linear part removed. In simulation on the linear part, a fixed time step may be used. Thus, the matrix of the linear part will not change and factorization will only be needed once for simulation on the linear part. Thus, it may also be relatively computationally inexpensive to perform factorization of the matrix as needed by simulation on linear elements. In other words, the number of factorizations required for performing simulation on the linear part as compared to the number of factorizations required for performing simulation on the linear part (i.e., the entire circuit) without partitioning.

Thus, in general, the techniques described herein allow the circuit to be partitioned into two circuits (linear and non-linear) for simulation. Two simulations are performed, one for each partitioned circuit, in pseudo-isolation so that the circuits appear numerically isolated in their respective simulations, with the other circuit modeled electrically such that the resulting simulated voltages are within accuracy tolerances.

By performing simulation by parts as discussed above, that is, separate simulation on non-linear and linear parts, the cost of matrix factorization may be significantly reduced—by reducing the number of factorizations for the linear part, which may be a relatively large RC network, i.e., a large part of the circuit being analyzed by simulation, and by reducing the size of the matrix for the non-linear part, which may be a relatively small part of the circuit being analyzed by simulation.

As discussed above, it may be desirable to have the two simulations, that is, the simulation on the non-linear part and the simulation on the linear part, communicate so that the circuit response in the simulations is sufficiently similar to the circuit response that would be expected in a simulation on the entire circuit, without partitioning. One approach is to model the RC network, i.e., the linear part, as a single capacitor with a value equal to a total capacitance of the RC network. Such an approach may preserve the average current in the RC network, which is an important measurement in electromigration (EM), as most EM rules are defined as average current limits. By maintaining the total capacitance of the RC network, the total charge delivered to the RC network is preserved, thus preserving the average current (total current/time).

During the simulation on the non-linear part, current into and out of all ports of the RC network (i.e., connection points between the two parts being simulated) may be measured or otherwise determined. Then, when simulation time (i.e., how far simulation has advanced in time) in the simulation on the non-linear part reaches an even multiple of the time step (i.e., amount of time a simulator advances in a single increment) of the RC network, i.e., the linear part, the measured/determined current may be input to the simulation on the RC network and a time step may be solved in the simulation on the RC network. Basically, when currents are measured from one part and input into the other part the two simulations need to have advanced the same amount of time, to have the simulations in sync. Current may be input into the RC network simulation by using current source elements attached to the ports and adjusting the current value of the current source elements continuously during the simulation. Thus, the two simulations may be performed concurrently, with determination and input of the current into the simulation of the RC network for solving a corresponding time step being repeated until a simulation stop time is reached in both simulations. The simulation stop time may be determined by the end user for reasons of their own. If the two simulations are in sync, they will share the same simulation stop time.

FIG. 1 illustrates a flowchart outlining one embodiment of a method of analyzing a circuit including a plurality of non-linear elements and a plurality of linear elements. It should be understood that the method shown is only an example, and that other methods may be envisioned in view of the disclosure provided herein.

In operational block S110, the circuit, such as data defining the circuit, may be provided. For example, the circuit may be designed using conventional design tools, such as CAD tools. The data that defines the circuit in such tools may be provided to a simulation system as disclosed herein for analysis. As such, it should be understood that the term providing is intended to encompass generating, creating, reading, downloading, inputting or otherwise making the circuit (data) available for simulation analysis.

The circuit may be partitioned into a non-linear part and a linear part in operational block S120. As discussed above, the term partitioning should be understood to encompass separating; transforming or otherwise identifying elements of the circuit to belong to one part or the other. Once an element is designated to be partitioned to the linear simulation, that element is no longer part of the non-linear simulation. The linear part may comprise an RC network of the circuit, for example, including all of the resistive and capacitive elements of the circuit. The non-linear part may include all of the non-linear elements of the circuit, such as transistors.

In operational block S130, a total capacitance of the linear elements may be determined. This may be accomplished by any suitable circuit analysis technique, either currently known or hereafter developed. Once the total capacitance has been determined, the linear elements may be modeled as a single capacitor with a capacitance value equal to the total capacitance. When the RC network is removed from the non-linear simulation and modeled as a single capacitor, the resistors are not effectively modeled any longer. This tends to result in higher RMS and peak currents, but is acceptable for EM analysis as this is error on the pessimistic side, resulting in overdesign of a working chip, rather than underdesign of a faulty one. Such modeling may also be accomplished by any suitable circuit analysis technique, either currently known or hereafter developed. Other modeling approaches may involve forms of RC reduction, such as pole/zero analysis and replacement of a large RC network with a smaller one representing only dominate poles/zeros.

In operational block S150, simulation on the non-linear part may be performed. This may be in pseudo-isolation of the linear part, as described herein. In other words, simulation of the non-linear part may be performed without the linear elements. During the simulation on the non-linear part, current into and out of the RC network defined by the linear elements may be determined. For example, the modeling of the RC network used in the simulation on the non-linear part may be used for the non-linear simulation.

The determined current may be input to the simulation on the linear part performed in operational block SI 70. As discussed above, this may help the circuit response of the linear elements to be more accurate, that is, more similar to the circuit response that would be observed without partitioning.

By obtaining results of the two simulations, that on the non-linear part and that on the linear part, as shown in operational block S180, a simulation analysis for the entire circuit may be accomplished. The results may be output in any known manner, such as to a screen, a printer, a storage device, etc., as appropriate or desired.

Figure 2:
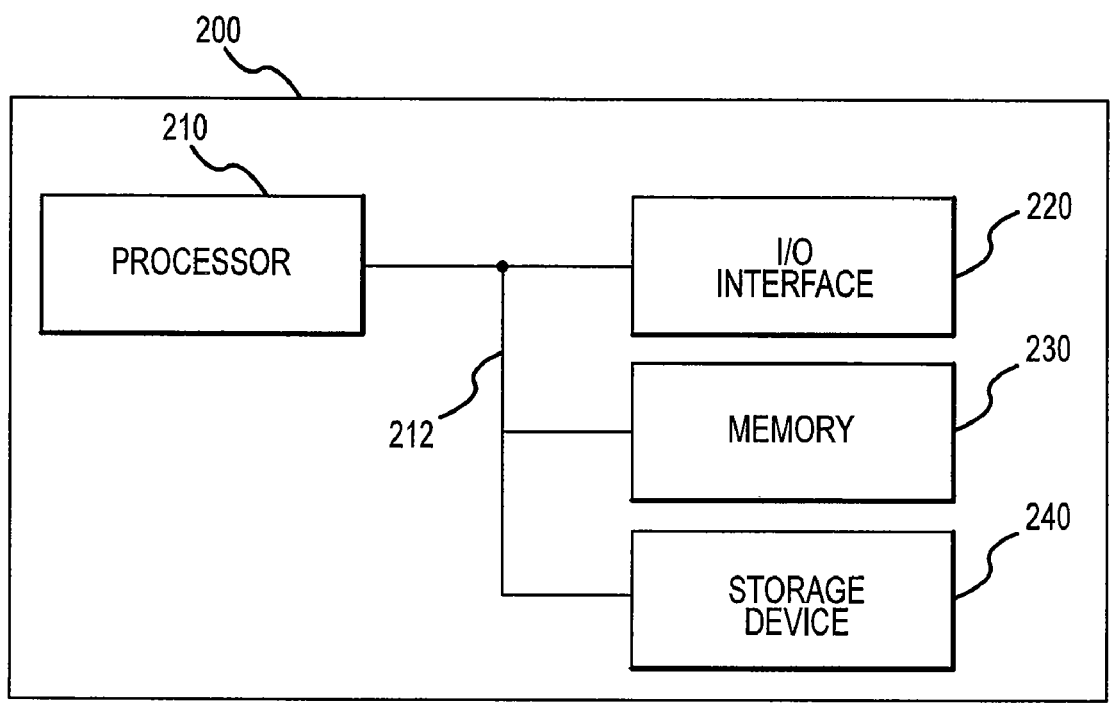
FIG. 2 illustrates a block diagram of an example of a system that may implement the method of FIG. 1.

Such a method as illustrated in FIG. 1 may be implemented on a system 200, as illustrated in FIG. 2. It should be understood that the system shown is only a high-level block diagram as an example, and that other systems may be envisioned in view of the disclosure provided herein.

The system 200 may include a processor 210 that is configured to perform the various operations of the methods described herein. It should be understood that the processor may be of any known type, and may be configured to perform particular operations by including various modules dedicated to such operations and/or by accessing software designed to perform such operations when executed by the processor and/or modules. The system 200 may also include an input/output (I/O) interface 220 that is coupled to the processor 210 in any suitable manner so as to communicate therewith. For example, a bus 212 or other link may be provided to facilitate communication between the processor 210 and other components of the system 200.

The I/O interface 220 may be configured to receive data defining a circuit to be processed for analysis by simulation. The received data may be at least temporarily stored in a memory 230 and/or a storage device 240 of the system 200 to facilitate processing. The memory 230 and/or the storage device 240 may also store software that may be accessed by the processor 210 to perform its processing operations.

The processing performed by the processor 210 may include partitioning the data defining the circuit into data defining linear elements of the circuit and data defining non-linear elements of the circuit. The processing performed by the processor 210 may also include determining a total capacitance of the linear part of the circuit and/or modeling the linear part as a single capacitor as discussed above.

The processor 210 may output the data defining linear elements of the circuit and data defining non-linear elements of the circuit, as well as the modeling, to another system, such as an existing simulation system configured to perform simulation analysis using the output data and/or modeling. Alternatively or additionally, the processor 210 may be configured to perform simulation on the data defining linear elements of the circuit and data defining non-linear elements of the circuit, as discussed above. In other words, the system 200 may be implemented as a stand alone system or as an adjunct to an existing simulation system that allows the existing simulation system to handle simulation analysis of circuits including relative large linear parts, e.g., a relatively large RC network, more efficiently, i.e., with reduced computational expense. It should also be understood that the system 200 may be implemented as hardware and/or software that may be incorporated into an existing simulation system.

Thus, it should be understood that the I/O interface 220 may also be configured to output results of the processing of the data defining the circuit performed by the processor 210, whether simulation results or intermediate results, such as the partitioned data.

It is also contemplated that aspects described herein may be implements as a computer-readable storage medium. Such a storage medium may include, but is not limited to, a hard-drive, a floppy diskette, a CD-ROM, RAM, flash memory, optical or magnetic storage media, etc. As such, the term computer-readable storage medium should be understood to encompass all physical structures that are configured to store instructions that, when executed by a computer, will cause the computer to perform certain operations.

Although the present invention has been described with respect to particular embodiments and operations, it should be understood that changes to the described embodiments and/or operations may be made and yet still embraced by alternative embodiments of the invention. For example, the figures are provided for purposes of illustration only and not limitation. As such, embodiments in addition to the specific examples provided are contemplated, as supported by the broad disclosure provided herein.

What is claimed is:

1. A method of analyzing a circuit including a plurality of non-linear elements and a plurality of linear elements, the method comprising:
   logically partitioning the circuit, utilizing a processor, into a non-linear part including the non-linear elements and a linear part including the linear elements;
   determining a total capacitance of the linear part;
   performing simulation on the non-linear part with the linear part removed and modeled as a single capacitor with a value equal to the total capacitance;
   determining current into and out of the ports of the single capacitor during simulation on the non-linear part;
   performing simulation on the linear part with the non-linear part removed by inputting the determined current into at least one port of the linear part; and
   combining the results of the simulation on the non-linear part and the simulation on the linear part.

2. The method of claim 1, wherein logically partitioning the circuit into a non-linear part and a linear part reduces a size of a matrix representation of the circuit that requires multiple factorizations for simulation.

3. The method of claim 1, wherein logically partitioning the circuit into a non-linear part and a linear part reduces a number of factorizations required for performing simulation on the linear part as compared to a number of factorizations required for performing simulation on the linear part without partitioning.

4. The method of claim 1, wherein performing simulation on the linear part involves only a single factorization of a matrix representation of the linear part.

5. The method of claim 1, wherein the linear elements define an RC network.

6. The method of claim 5, wherein inputting the determined current is performed when simulation time reaches an even multiple of a time step of the RC network, further comprising solving a corresponding time step in the simulation on the linear part.

7. The method of claim 6, further comprising repeating the determining, inputting and solving until a simulation stop time is reached in both the simulation on the linear part and the simulation on the non-linear part.

8. A system for analyzing a circuit including a plurality of non-linear elements and a plurality of linear elements, the system comprising:
   an input configured to receive data defining the circuit, including data defining the linear elements and data defining the nonlinear elements; and
   at least one processor coupled to the input and configured to:
      logically partition the data defining the circuit into data defining a non-linear part including the non-linear elements and data defining a linear part including the linear elements;
      determine a total capacitance of the linear part;
      perform simulation on the data defining the non-linear part separate from the data defining the linear part by modeling the linear part as a single capacitor with a value equal to the total capacitance;
      determine current into and out of the ports of the single capacitor during simulation on the data defining the non-linear elements part; and
      perform simulation on the data defining the linear part separate from the data defining the non-linear part by inputting the determined current into at least one port of the linear part.

9. The system of claim 8, wherein the at least one processor is configured to partition the data defining the circuit to reduce a size of a matrix representation of the circuit that requires multiple factorizations for simulation.

10. The system of claim 8, wherein the at least one processor is configured to partition the data defining the circuit to reduce a number of factorizations required for performing simulation on the data defining the linear part as compared to a number of factorizations required for performing simulation on the data defining the linear part without partitioning.

11. The system of claim 8, wherein the linear elements define an RC network.

12. The system of claim 11, wherein the at least one processor is configured to input the determined current when simulation time reaches an even multiple of a time step of the RC network, and is configured to solve a corresponding time step in the simulation on the linear part.

13. The system of claim 12, wherein the at least one processor is configured to continue to determine current, input the determined current and solve corresponding time steps until a simulation stop time is reached in both the simulation on the data defining the linear part and the simulation on the data defining the non-linear part.

14. A computer-readable storage medium including stored instructions that, when executed by a computer, cause the computer to perform analysis of a circuit including a plurality of non-linear elements and a plurality of linear elements by:
   logically partitioning the circuit into a non-linear part including the non-linear elements and a linear part including the linear elements;
   determining a total capacitance of the linear part;
   performing simulation on data defining the non-linear part separate from the linear part, the linear part modeled as a single capacitor with a value equal to the total capacitance;
   determining current into and out of the ports of the single capacitor during simulation on the data defining the non-linear part;
   performing simulation on the linear part separate from the data defining the non-linear part by inputting the determined current into at least one port of the linear part; and
   outputting a result of the performed simulations.

15. The computer-readable storage medium of claim 14, wherein the linear elements define an RC network.

* * * * *